(12) United States Patent
Das et al.

(10) Patent No.: US 8,446,707 B1
(45) Date of Patent: May 21, 2013

(54) CIRCUITIZED SUBSTRATE WITH LOW LOSS CAPACITIVE MATERIAL AND METHOD OF MAKING SAME

(75) Inventors: Rabindra N. Das, Vestal, NY (US); Konstantinos I. Papathomas, Endicott, NY (US); Voya R. Markovich, Endwell, NY (US); James J. McNamara, Endwell, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 13/269,770

(22) Filed: Oct. 10, 2011

(51) Int. Cl.
*H01G 4/06* (2006.01)

(52) U.S. Cl.
USPC .............. 361/321.5; 361/321.1; 361/321.2; 361/303; 361/305; 361/313

(58) Field of Classification Search
USPC ....... 361/321.5, 766, 792, 893, 795; 174/255, 174/260, 262, 258–259
See application file for complete search history.

(56) References Cited

U.S. PATENT DOCUMENTS

| | | | |
|---|---|---|---|
| 4,687,803 A * | 8/1987 | Teramoto et al. | 524/413 |
| 5,079,069 A | 1/1992 | Howard et al. | |
| 5,162,977 A | 11/1992 | Paurus et al. | |
| 6,352,782 B2 | 3/2002 | Yeager et al. | |
| 6,544,651 B2 | 4/2003 | Wong et al. | |
| 6,616,794 B2 | 9/2003 | Hartman et al. | |
| 7,078,816 B2 | 7/2006 | Japp et al. | |
| 7,259,333 B2 * | 8/2007 | Japp et al. | 174/255 |
| 7,384,856 B2 | 6/2008 | Das et al. | |
| 7,541,265 B2 | 6/2009 | Das et al. | |
| 7,655,278 B2 | 2/2010 | Braidwood et al. | |
| 7,791,897 B2 | 9/2010 | Das et al. | |
| 2010/0167210 A1 | 7/2010 | Das et al. | |

* cited by examiner

*Primary Examiner* — Nguyen T Ha
(74) *Attorney, Agent, or Firm* — Mark Levy; Hinman, Howard & Kattell, LLP

(57) ABSTRACT

A low loss capacitance and low loss insulating dielectric material consisting of a thermosetting resin, thermoplastic resin, a cross-linker, and containing a quantity of ferroelectric ceramic nano-particles of barium titanate within. The combined low loss insulating dielectric layer and a low loss capacitive layer resulting from the material allows one continuous layer that can form internal capacitors and permit the modifying the dielectric thickness between signal layers for impedance matching within a layer of substrate. More significantly, the applied layer of low loss capacitive materials can simultaneously act as a capacitor as well as a dielectric for separation of signal layers.

11 Claims, 11 Drawing Sheets

CIRCUITIZED SUBSTRATE WITH LOW LOSS CAPACITIVE MATERIAL AND METHOD OF MAKING SAME

RELATED APPLICATIONS

The present application is related to co-pending U.S. patent application Ser. No. 12/720,849 for MULTI-LAYER EMBEDDED CAPACITANCE AND RESISTANCE SUBSTRATE CORE filed Mar. 10, 2010, which is a divisional application of U.S. patent application Ser. No. 12/283,146 filed Sep. 9, 2008, now U.S. Pat. No. 7,791,897 issued Sep. 7, 2010, and are incorporated by reference herein in their entirety.

FIELD OF THE INVENTION

The present invention relates to printed circuit board substrates and, more particularly, to a printed circuit board substrate enabling the simultaneous functioning as a low loss insulating dielectric layer and as a low loss capacitive layer.

BACKGROUND OF THE INVENTION

Circuitized substrates such as printed circuit boards (hereinafter also referred to as PCBs), chip carriers, and the like are typically constructed in laminate form in which several layers of dielectric material and conductive material (laminates) are bonded together using relatively high temperature and pressure lamination processes. The conductive layers, typically of thin copper, are usually used in the formed substrate for providing electrical connections to and among various devices located on the surface of the substrate. Examples of such devices are integrated circuits (semiconductor chips) and discrete passive devices, such as capacitors, resistors, inductors, and the like. Discrete passive devices occupy a high percentage of the surface area of the completed substrate, which is undesirable because of the increased demand for miniaturization of products. In order to increase the available substrate surface area, multiple functions can be provided on a single component for mounting on a board. When passive devices are in such a configuration, these are often referred to as integral passive devices; the functions are integrated into the singular component. Because of such external positioning, however, these components still utilize, albeit less than if in singular form, valuable board real estate. In response, there have also been efforts to embed discrete passive components within the board.

A capacitor designed for disposition within a PCB substrate may thus be referred to as an embedded integral passive component or, more simply, an embedded capacitor. Such a capacitor provides internal capacitance. The result of this internal positioning is that it is unnecessary to also position such devices externally on the PCB's outer surface(s).

With respect to a fixed capacitor area, two known approaches increase the planar capacitance (capacitance/area) of an internal capacitor. In one such approach, higher dielectric constant materials can be used, while in a second, the thickness of the dielectric can be reduced. These constraints are reflected in the following formula for capacitance per area:

$C/A$=Dielectric Constant of Laminate×Dielectric Constant in Vacuum/Dielectric

Thickness where: C is the capacitance and A is the area of the capacitor.

As mentioned above, there have been attempts to provide internal capacitance and other internal conductive structures, components or devices within circuitized substrates such as PCBs, some of these including the use of nano-powders.

The needs of the semiconductor marketplace continue to drive density into semiconductor packages. Traditionally, greater wiring densities have been achieved by reducing the dimensions of vias, lines, and spaces, increasing the number of wiring layers, and utilizing blind and buried vias. However, each of these approaches, for example, those related to drilling and plating of high aspect ratio vias, reduced conductance of narrow circuit lines, and increased cost of fabrication related to additional wiring layers, includes inherent limitations.

PCBs, chip carriers and related products used in many of today's technologies must include multiple circuits in a minimum volume or space. Typically, such products comprise a stack of layers of signal, ground and/or power planes separated from each other by at least one layer of electrically insulating dielectric material. The circuit lines or pads (e.g., those of the signal planes) are often in electrical contact with each other by plated holes passing through the dielectric layers. The plated holes are often referred to as vias if internally located, blind vias if extending a predetermined depth within the board from an external surface, or plated-thruholes (hereinafter also referred to simply as PTHs) if extending substantially through the board's full thickness. The term thru-hole as used herein is meant to include all three types of such board openings.

Complexity of these products has increased significantly in recent years. PCBs for mainframe computers may have as many as seventy-two layers of circuitry or more, with the complete stack having a thickness of as much as about 0.8 inch (800 mils). These boards are typically designed with three or five mil wide signal lines and twelve mil diameter thru-holes. Increased circuit densification requirements seek to reduce signal lines to a width of two mils or less and thru-hole diameters to two mils or less. Many known commercial procedures, especially those of the nature described herein, are incapable of economically forming these dimensions now desired by the industry. Such processes typically comprise fabrication of separate innerlayer circuits (circuitized layers), which are formed by coating a photosensitive layer or film over the copper layer of a copper clad innerlayer base material. The photosensitive coating is imaged and developed and the exposed copper is etched to form conductor lines. After etching, the photosensitive film is stripped from the copper, leaving the circuit pattern on the surface of the innerlayer base material. This processing is also referred to as photolithographic processing in the PCB art and further description is not deemed necessary.

After the formation of the individual innerlayer circuits, a multilayer stack is formed by preparing a lay-up of core innerlayers, ground planes, power planes, etc., typically separated from each other by a dielectric prepreg comprising a layer of glass (typically fiberglass) cloth impregnated with a partially cured material, typically a B-stage epoxy resin. The top and bottom outer layers of the stack usually comprise copper clad, glass-filled epoxy planar substrates with the copper cladding comprising the exterior surfaces of the stack. The stack is laminated to form a monolithic structure using heat and pressure to fully cure the B-stage resin. The stack so formed typically has metal (usually copper) cladding on both of its exterior surfaces. Exterior circuit layers are formed in the copper cladding using procedures similar to the procedures used to form the innerlayer circuits. A photosensitive film is applied to the copper cladding. The coating is exposed to patterned activating radiation and developed. An etchant is then used to remove copper bared by the development of the photosensitive film. Finally, the remaining photosensitive film is removed to provide the exterior circuit layers.

The aforementioned thru-holes (also often referred to as interconnects) are used in many such substrates to electrically connect individual circuit layers within the structure to each other and to the outer surfaces. The thru-holes typically pass through all or a portion of the stack. Thru-holes are generally formed prior to the formation of circuits on the exterior surfaces by drilling holes through the stack at appropriate locations. Following several pre-treatment steps, the walls of the holes are catalyzed by contact with a plating catalyst and metallized, typically by contact with an electroless or electrolytic copper plating solution to form conductive pathways between circuit layers. Following formation of the conductive thru-holes, exterior circuits, or outerlayers are formed using the procedure described above.

The necessity of developing ever-increasing high speed circuitized substrates for use in many of today's new products has led to the exploration of new materials to extend the electrical and thermal performance limits of the presently available technology. For high-speed applications, it is necessary to have extremely dense conductor circuitry patterning on low dielectric constant insulating material. Prepreg laminates for conventional circuit boards consist of a base reinforcing glass fabric impregnated with a resin, also referred to by some in the industry as FR-4 dielectric material. Epoxy/glass laminates used in some current products typically contain approximately 40% by weight fiberglass and 60% by weight epoxy resin.

What is needed to extend the electrical and thermal performance limits of the presently available technology is a low loss capacitive material that enables the simultaneous function as a low loss insulating dielectric layer or as a capacitive layer that is location specific and implemented when needed while the development of new materials progresses. For even higher-speed and tighter space-restricted applications, it may be necessary to provide the board manufacturer with the intrinsic capability of the combination of low loss capacitive and low loss insulating dielectric material.

DISCUSSION OF RELATED ART

U.S. Pat. No. 6,616,794, issued Sep. 9, 2003 to Hartman et al., for INTEGRAL CAPACITANCE FOR PRINTED CIRCUIT BOARD USING DIELECTRIC NANO-POWDERS, discloses a method for producing integral capacitance components for inclusion within printed circuit boards. Hydrothermally prepared nano-powders permit the fabrication of a very thin dielectric layers that offer increased dielectric constants and are readily penetrated by microvias. Disclosed is a method of preparing a slurry or suspension of a hydro-thermally prepared nano-powder and solvent. A suitable bonding material, such as a polymer is mixed with the nano-powder slurry, to generate a composite mixture that is formed into a dielectric layer. The dielectric layer may be placed upon a conductive layer prior to curing, or conductive layers may be applied upon a cured dielectric layer, either by lamination or by metallization processes, such as vapor deposition or sputtering.

U.S. Pat. No. 7,655,278, issued Feb. 2, 2010 to Braidwood et al., for COMPOSITE-FORMING METHOD, COMPOSITES FORMED THEREBY, AND PRINTED CIRCUIT BOARDS INCORPORATING THEM, discloses a composite-forming process that includes impregnating a reinforcing structure with a curable composition at a temperature of about 10 to about 40° C. The curable composition includes specific amounts of an epoxy resin, a poly(arylene ether), a solvent, and a curing promoter. The poly(arylene ether) includes, on average, about 1.6 to about 2.4 phenolic hydroxy groups per molecule, and it has a polydispersity index less than or equal to 2.2 and an intrinsic viscosity of about 0.03 to about 0.2 deciliter per gram.

These characteristics improve the solubility of the poly (arylene ether) in the curable composition and allow the curable composition to be formed and used at or near room temperature.

U.S. Pat. No. 6,352,782, issued Mar. 5, 2002 to Yeager et al., for POLY(PHENYLENE ETHER)-POLYVINYL THERMOSETTING RESIN, discloses a capped poly(phenylene ether) resin composition is formed from a poly(phenylene ether) compound (PPE) in which at least a portion, preferably substantially all of the hydroxyl groups have been reacted with a compound containing ethylenic unsaturation (carbon-carbon double bonds) which is further reactive with unsaturated monomers (reactively endcapped PPE) and a curable unsaturated monomer composition. The composition optionally contains a polymerization catalyst; a flame-retardant compound; and fibrous reinforcement. The composition can be cured to form a laminate, and clad with copper to form a circuit board.

U.S. Pat. No. 6,544,651, issued Apr. 8, 2003 to Wong et al., for HIGH DIELECTRIC CONSTANT NANO-STRUCTURE POLYMER-CERAMIC COMPOSITE, discloses a polymer-ceramic composite having high dielectric constants formed using polymers containing a metal acetylacetonate (acacs) curing catalyst. The high dielectric polymers are combined with fillers, preferably ceramic fillers, to form two-phase composites having high dielectric constants. Composites having about 30 to about 90% volume ceramic loading and a high dielectric base polymer, preferably epoxy, have been discovered to have a dielectric constants greater than about 60. Composites having dielectric constants greater than about 74 to about 150 are also disclosed. Also disclosed are embedded capacitors with capacitance densities of at least 25 $nF/cm^2$, preferably at least 35 $nF/cm^2$, most preferably 50 $nF/cm^2$. Methods to increase the dielectric constant of the two phase composites having high dielectric constants are also provided.

U.S. Pat. No. 5,162,977, issued Nov. 10, 1992 to Paurus et al., for PRINTED CIRCUIT BOARD HAVING AN INTEGRATED DECOUPLING CAPACITIVE ELEMENT, discloses a printed circuit board that includes a high capacitance power distribution core, the manufacture of which is compatible with standard printed circuit board assembly technology. The high capacitance core consists of a ground plane and a power plane separated by a planar element having a high dielectric constant. The high dielectric constant material is typically glass fiber impregnated with a bonding material, such as epoxy resin loaded with a ferroelectric ceramic substance having a high dielectric constant. The ferroelectric ceramic substance is typically a nano-powder combined with an epoxy bonding material. The resulting capacitance of the power distribution core is typically sufficient to totally eliminate the need for decoupling capacitors on a typical printed circuit board.

U.S. Pat. No. 5,079,069, issued Jan. 7, 1992 to Howard et al., for CAPACITOR LAMINATE FOR USE IN CAPACITIVE PRINTED CIRCUIT BOARDS AND METHODS OF MANUFACTURE, discloses a capacitor laminate as either an intermediate product for use in a capacitive printed circuit board or as part of the assembled printed circuit board in order to provide a bypass capacitive function for large numbers of devices mounted or formed on the printed circuit board, the capacitor laminate being formed from sheets of conductive material and an intermediate sheet of dielectric material forming the laminated capacitor as a structurally rigid assembly and facilitating its inclusion within the PCB, components of the capacitor laminate having selected characteristics whereby each individual device is provided with capacitance by a proportional portion of the capacitor laminate and by borrowed capacitance from other portions of the capacitor laminate, the capacitive function of the capacitor laminate being dependent upon random firing or operation of the devices. Methods of manufacture for the capacitor laminate as well as the capacitive PCB are also described.

U.S. Pat. No. 7,078,816, issued Jul. 18, 2006 to Japp et al., for CIRCUITIZED SUBSTRATE, discloses a circuitized substrate comprising a first layer comprising a dielectric material including a resin material including a predetermined quantity of particles therein and not including continuous fibers, semi-continuous fibers or the like as part thereof, and at least one circuitized layer positioned on the dielectric first layer. An electrical assembly and a method of making the substrate are also provided, as is a circuitized structure including the circuitized substrate in combination with other circuitized substrates having lesser dense thru-hole patterns.

U.S. Pat. No. 7,541,265, issued Jun. 2, 2009 to Das et al., for CAPACITOR MATERIAL FOR USE IN CIRCUITIZED SUBSTRATES, CIRCUITIZED SUBSTRATE UTILIZING SAME, METHOD OF MAKING SAID CIRCUITIZED SUBSTRATE, AND INFORMATION HANDLING SYSTEM UTILIZING SAID CIRCUITIZED SUBSTRATE, discloses a material for use as part of an internal capacitor within a circuitized substrate and including a polymer (e.g., a cycloaliphatic epoxy or phenoxy based) resin and a quantity of nano-powders of ferroelectric ceramic material (e.g., barium titanate) having a particle size substantially in the range of from about 0.01 micron to about 0.90 micron and a surface area for selected ones of said particles within the range of from about 2.0 to about 20 square meters per gram. A circuitized substrate adapted for using such a material and capacitor therein and a method of making such a substrate are also provided. An electrical assembly (substrate and at least one electrical component) and an information handling system (e.g., personal computer) are also provided.

U.S. Pat. No. 7,384,856, issued Jun. 10, 2008 to Das et al., for METHOD OF MAKING AN INTERNAL CAPACITIVE SUBSTRATE FOR USE IN A CIRCUITIZED SUBSTRATE AND METHOD OF MAKING SAID CIRCUITIZED SUBSTRATE, discloses a method of forming a capacitive substrate in which first and second conductors are formed opposite a dielectric, with one of these electrically coupled to a thru-hole connection. Each functions as an electrode for the resulting capacitor. The substrate is then adapted for being incorporated within a larger structure to form a circuitized substrate such as a printed circuit board or a chip carrier. The previously disclosed United States issued patents fail to adequately describe the present invention's combination of a low loss capacitive material that enables simultaneous functioning as a low loss insulating dielectric layer and as a low loss capacitive layer It is therefore an object of the invention to provide a low loss capacitive material that enables simultaneous functioning as a low loss insulating dielectric layer and as a low loss capacitive layer.

It is another object of the invention to provide a low loss insulating dielectric layer and a low loss capacitive layer in the same material layer.

It is still yet another object of the invention to provide a combined low loss insulating dielectric layer and a low loss capacitive layer that function as an integral part of a larger subassembly.

It is yet still another object of the invention to provide a modified poly-(phenylene) ether (MPPE) chemistry based material with low polarizability.

It is yet another object of the invention to provide an MPPE based material with no active dipoles, hence creating a low loss material having lower signal loss due to reduced signal dissipation.

It is yet another object of the invention to provide an MPPE based material with no active dipoles, creating a frequency stable and of significantly low loss material.

It is yet another object of the invention to provide an MPPE based material with no active dipoles, creating a temperature stable and low loss material.

It is yet another object of the invention to provide an MPPE based material with no active dipoles, creating a temperature stable, frequency stable and low loss material.

SUMMARY OF THE INVENTION

The present invention represents an approach to provide a combined low loss insulating dielectric layer and a low loss capacitive layer in one continuous layer that can form internal capacitors and allow for modifying the dielectric thickness between signal layers for impedance matching within a layer of substrate. In the present invention, at least one capacitor may be formed by initially forming a first capacitive substrate, positioning layers of photoimageable material atop the substrate and thereafter removing portions thereof to expose the capacitive substrate's conductors, then forming a quantity of capacitive material on the two exposed conductors. This process can also provide a dielectric layer to separate signal layers and is also capable of being performed using known technologies. The capacitors formed using the teachings herein are capable of having nano and/or micro particles as part thereof. More significantly, the applied layer of low loss capacitive materials can simultaneously act as a capacitor as well as a dielectric for signal layers. It is believed that such a method, as well as a method of forming a larger circuitized substrate including the capacitive substrate, represent significant advancements in the art.

BRIEF DESCRIPTION OF THE DRAWINGS

A complete understanding of the present invention may be obtained by reference to the accompanying drawings, when considered in conjunction with the subsequent detailed description, in which.

For the sake of clarity and brevity, like elements and components of each embodiment will bear the same designations throughout the description.

DESCRIPTION OF THE PREFERRED EMBODIMENT

Figure 1:
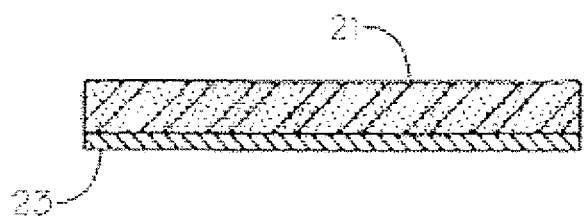
FIGS. 1 and 2 are side elevational views, in section and on an enlarged scale, illustrating the steps of making a capacitor member in accordance with one embodiment of the invention.

Generally speaking, the present invention features a combined low loss insulating dielectric layer and a low loss capacitive layer in one continuous layer that can form internal capacitors and allow for modifying the dielectric thickness between signal layers for impedance matching within a layer of substrate.

An embodiment of the invention incorporates a reinforced starting core that can be laser drilled with small holes and provides a reduced CTE (7 to 15 ppm/C). The structure has capacitors sequentially applied on the surface, allowing for multiple capacitor layers in a thin total structure. The resin coated copper capacitive layer need not supply any structural support; it can be very thin and achieve high values of capacitance per unit area. Also, since it is not structural, the choices of material expand significantly. The structure with small vias allows the vias to thread through the legs of the serpentine resistors and significantly improves z-directional communication. This is especially important when there are multiple voltages supported by the capacitor layers. The overall approach lends itself to package miniaturization because capacitance can be increased through multiple layers and where capacitance is not needed, the low loss capacitance material can act as a dielectric to separate signal layers.

For a better understanding of the present invention, together with other and further objects, advantages and capabilities thereof, reference is made to the following disclosure and appended claims.

By the term "capacitive substrate" as used herein is meant a substrate including at least one capacitive dielectric layer and at least two conductors, which combine to form at least one capacitor. Such substrates, in the simplest form, are adapted for being used as a substrate having other electrical components electrically coupled thereto, e.g., to form an electrical assembly. In the preferred embodiments, however, the capacitive substrates as formed in accordance with the teachings herein are preferably incorporated within a larger substrate structure to form a circuitized substrate such that the capacitive substrate is an internal structure of the larger circuitized substrate. As defined, more than one of these capacitive substrates may be included within the larger circuitized substrate. Also, in the embodiments described herein, the number of signal layers can be the same or less than the total number of capacitance layers.

By the term "capacitor member" as used herein is meant a member comprising at least two conductor layers and an interim quantity of capacitor material, said capacitor member adapted for being positioned within and thus part of a capacitive substrate.

By the term "circuitized substrate" as used hereinbelow is meant to include substrates having at least one (and, preferably, a plurality of) dielectric layer(s) and at least one (and, preferably, a plurality of) electrically conductive layer (s). If more than one of each, the layers can be arranged in an alternating manner. Examples of materials usable for such dielectric substrates include modified poly(phenylene) ether (MPPE) resin, fiberglass-reinforced epoxy resins (some referred to as "FR-4" dielectric materials in the art, for the flame retardant rating of same), polytetrafluoroethylene (e.g., Teflon), polyimides, polyamides, cyanate resins, photoimageable materials, and other like materials, including combinations thereof. Examples of conductor materials usable in such substrates include copper or copper alloys, but may include or comprise additional metals (e.g., nickel, aluminum, etc.) or alloys thereof. Such conductor materials are used to form layers, which may serve as power, signal and/or ground layers. If as a signal layer, several conductor lines and/or pads may constitute the layer, while if used as power or ground, such layers will typically be of substantially solid construction. Combinations of signal and power and/or ground are possible. One particular example of a circuitized substrate for use herein is a chip carrier sold under the name HyperBGA® by the Assignee of this invention, Endicott Interconnect Technologies, Inc. (HyperBGA being a registered trademark of Endicott Interconnect Technologies, Inc.)

By the term "conductive paste" as used herein is meant an electrically conductive paste composition, including solder paste, adapted for use between conductive members to provide an electrical path between these members. Examples include silver based conductive adhesive pastes available commercially under the trade name "Ablebond 8175" from Ablestick of Delhi, India, and under the trade name "CB100" from the E. I. du Pont de Nemours & Company. An example of suitable eutectic solder paste that may be used is Alpha 3060 from Alpha Metals (Jersey City, N.J.).

By the term "continuous" as used herein to define fibrous materials is meant a structure such as a woven cloth including lengthy fibers, including fibers that run the full distance through the structure.

By the term "semi-continuous" as used herein to define fibrous materials is meant structures with much shortened length fibers, which are also referred to as "chopped" fibers, one example being chopped fiber mats.

By the term "electrical assembly" is meant at least one circuitized substrate as defined herein in combination with at least one electrical component electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface or to internal conductors using one or more thru-holes. A well-known assembly is the conventional printed circuit board (PCB) typically having several external components such as chip carriers, semiconductor chips, etc. mounted thereon and coupled to the internal circuitry of the PCB.

By the term "electrical component" as used herein is meant components such as semiconductor chips and the like which are adapted for being positioned on the external conductive surfaces of circuitized substrates and electrically coupled to the substrate for passing signals from the component into the substrate (including into the internal capacitive substrate) whereupon such signals may be passed on to other components, including those mounted also on the substrate, as well as other components such as those of a larger electrical system in which the substrate is positioned.

By the term "electroplating" as used herein is meant a process by which a metal in its ionic form is supplied with electrons to form a non-ionic coating on a desired substrate. The most common system involves: a chemical solution which contains the ionic form of the metal, an anode (positively charged) which may consist of the metal being plated (a soluble anode) or an insoluble anode (usually carbon, platinum, titanium, lead, or steel), and finally, a cathode (negatively charged) where electrons are supplied to produce a film of non-ionic metal.

By the term "electroless plating" (also known as chemical or auto-catalytic plating) as used herein is meant a non-galvanic type of plating method that involves several simultaneous reactions in an aqueous solution, which occur without the use of external electrical power. The reaction is accomplished when hydrogen is released by a reducing agent, normally sodium hypophosphite, and oxidized thus producing a negative charge on the surface of the part.

By the term "electronic package" as used herein is meant a circuitized substrate assembly as taught herein having one or more ICs (e.g., semiconductor chips) positioned thereon and electrically coupled thereto. In a multi-chip electronic package, for example, a processor, a memory device and a logic chip may be utilized and oriented in a manner designed for minimizing the limitation of system operational speed caused by long connection paths. Some examples of such packages, including those with a single chip or a plurality thereof, are also referred to in the art as chip carriers.

By the term "etch" and "etching" as used herein is meant a process by where a surface of a substrate is either selectively etched using a photoresist or covered by a mask prior to plasma treating, both methods are meant to transfer an image onto the substrate for subsequent further processing.

By the term "ferroelectric ceramic" as used herein is meant ceramics that possess ferroelectric properties. These include barium titanate, substituted barium titanate, strontium titanate, lead titanate, lead zirconate titanate, substituted lead zirconate titanate, lead magnesium niobate, lead zinc niobate, lead iron niobate, solid solutions of lead magnesium niobate and lead titanate, solid solutions of lead zinc niobate and lead titanate, lead iron tantalite, other ferroelectric tantalates, and combinations or mixtures thereof.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc. Such systems typically include one or more PCBs, chip carriers, etc. as integral parts thereof. For example, a PCB typically used includes a plurality of various components such as chip carriers, capacitors, resistors, modules, etc. mounted thereon. One such PCB may be referred to as a "motherboard" while various other boards (or cards) may be mounted thereon using suitable electrical connectors.

By the term "laser ablation" as used herein is meant the process of removing material from a solid surface by irradiating it with a laser beam. At low laser flux, the material is heated by the absorbed laser energy and evaporates or sublimes. At high laser flux, the material is typically converted to a plasma. The term laser ablation as used herein refers to removing material with a pulsed laser as well as ablating material with a continuous wave laser beam if the laser intensity is high enough.

By the term "nano-particles" is meant particles with a size of from approximately 0.01 micron (ten nanometers) to approximately one micron (1000 nanometers).

By the term "thru-hole" as used herein is meant what are commonly referred to in the industry as "blind vias" which are openings typically from one surface of a substrate to a predetermined distance therein, "internal vias" which are vias or openings located internally of the substrate and are typically formed within one or more internal layers prior to lamination thereof to other layers to form the ultimate structure, and "plated-thru-holes" (also known as PTHS), which typically extend through the entire thickness of a substrate. All of these various openings form electrical paths through the substrate and often include one or more electrically conductive layers. Alternatively, such openings may simply include a quantity of conductive paste or, still further, the paste can be additional to plated metal on the opening sidewalls. These openings in the substrate are formed typically using mechanical drilling or laser ablation, following which the plating and/or conductive paste are be added.

In FIG. 1, a quantity of capacitor material 21 is positioned onto a first electrically conductive member (hereinafter also referred to simply as conductor) 23, to an initial thickness of from approximately 0.2 mil to approximately 5.0 mils. A preferred method of applying material 21 is in liquid form, using, for example, a curtain, roller or drawdown coating process. Such application is also preferably accomplished in a roll-to-roll format. Alternatively, it is also possible to deposit material 21 in paste form using a screen-printing operation or in ink form using a ink-jet printing operation. Material 21 comprises a thermosetting resin, a thermoplastic resin, a high molecular mass flexibilizer, and a quantity of nano-particles of a ferroelectric ceramic material. Significantly, the material forming the layer is not applied onto a supporting web such as fiberglass mesh, and thus does not include continuous or semi-continuous fibers as part thereof. Equally significant, the coated material 21 may have a thickness of from approximately two to three microns, an extremely valuable characteristic when considering the microminiaturization demanded in many of today's electrical products such as substrates of the type defined herein. In one example, material 21 was coated to a thickness of only 2.5 microns.

A preferred resin used for material 21 is a modified polyphenylene ether (MPPE) resin in combination with trifunctional isocyanurates constituting a true interpenetrating network. Other resin modifiers and free radical initiators to assist in the formation of the network maybe used as well. Other acceptable thermosetting resins usable herein include, but are not limited to high temperature diglycidyl ether, polyimide, cyanate ester (triazines), bismaleimide, bismaleimide and epoxy modified blend, benzoxazine, epoxy modified benzoxazine, halogen free benzoxazine, fluoropolymer, benzocyclobutene, perfluorobutane, polyphenylenesulfide, polysulfone, polyetherimide, polyetherketone, polyphenylquinoxaline, polybenzoxazole, polyphenyl benzobisthiazole and combinations thereof. In general the epoxy resin may be selected from the group including the diglycidyl ethers of resorcinol, catechol, hydroquinone, biphenol, bisphenol A, tetrabromobisphenol A, phenolaldehyde novolac resins, alkyl substituted phenol-aldehyde resins, bisphenol F, tetramethylbiphenol, tetramethyltetrabromophenol, tetrachlorobisphenol A, and combinations thereof. The cyanate esters, if used, may be selected from the group consisting of cyanatobenzene, dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4'-dicyanatobiphenyl, bis(4-cyanatophenyl)methane, 2,2-bis(4-cyanatophenyl)propane, 2,2-bis(3,5-dichloro 4-cyanatophenyl)propane, 2,2-bis(3,5-diblomo 4-dicyanatophenyl)propane, bis(4-cyanatophenyl)ether, bis(4-cyanatophenyl)thioether, bis(4-cyanatophenyl)sulfone, tris(4-cyanatophenyl)-phosphite, tris(4-cyanatophenyl)phosphate, bis(3-chloro-4-cyanatophenyl)methane, cyanated novolak derived from novolak cyanated disphenol type polycarbonate oligomer derived from bisphenol type polycarbonate oligomers, and combinations thereof.

Thermoplastic resin is selected from a group consisting of: polyolefins such as polypropylene, polysulfones, polycarbonates, nitrile rubbers, polymers based on second generation styrenic block copolymers with a hydrogenated midblock of styrene-ethylene/butylene-styrene (SEBS) or styrene-ethylene/propylene-styrene (SEPS), ABS polymers, and fluorocarbon polymers such as polytetrafluoroethylene, polymers of chlorotrifluoroethylene, fluorinated ethylenepropylene polymers, polyvinylidene fluoride and polyhexafluoropropylene and combinations thereof. Alternatively, polytetrafluoroethylene (PTFE), fluorinated ethylene-propylene (FEP), poly ether ether ketone (PEEK) or PTFE/PEEK blend can be used as the polymer for the dielectric. 10 to 90 wt % PTFE in the PTFE/PEEK blend can be used.

It is further possible to use cross linking agent. Cross linker can be selected from a group consisting of: at least one cyanurate selected from the group consisting of triallyl isocyanurate and triallyl cyanurate.

A preferred ferroelectric ceramic material used herein is barium titanate ($BaTiO_3$) powder available from Cabot Corporation under the product designation "BT-8", Cabot Corporation having a business location in Boyertown, Pa. An alternative $BaTiO_3$ powder is also available from the Nippon Chemical Industrial Co., Ltd., of Tokyo, Japan. Other such ceramics include substituted barium titanate, calcium titanate, strontium titanate, lead titanate, lead zirconate titanate, substituted lead zirconate titanate, lead magnesium niobate, lead zinc niobate, lead iron niobate, solid solutions of lead magnesium niobate and lead titanate, solid solutions of lead zinc niobate and lead titanate, lead iron tantalite, other ferroelectric tantalates, tantalum oxide, titanium oxide and combinations or mixtures thereof. Of importance, it has been determined that material 21 should include less than approximately eighty percent (by weight) of barium titanate in the material's final form (following heating), with more detailed examples below. Such a percentage is deemed important to assure non-flaking of the material following heating to remove the solvent carrier and partially advance the thermosetting resin thereof as defined below. The particles of the ferroelectric ceramic are nano-particles, having the dimensions cited above. The ceramic particle loading in the polymer matrix is less than 80 wt % to maintain non-flaking characteristics. Around 40 wt % to 75 wt % is the preferred particle loading but other loading, can be used as well.

A preferred first conductor member 23 is a copper or copper alloy foil, having a thickness of from approximately 0.1 mil to approximately 4.0 mils and, in the example above where material 21 is of a 2.5-micron thickness, is preferably 1.0 mil thick.

Following deposition, the capacitor material 21 (and conductor 15) is/are heated to a temperature within the range of from approximately 120 degrees C. to approximately 140 degrees C. for approximately two minutes to approximately four minutes. In one example, with a 2.5-micron material thickness, the material 21 and conductor 15 were heated to 130 degrees C. for approximately three minutes. This is preferably accomplished by placing the structure shown in FIG. 1 within a suitable convection oven. Such heating, in addition to driving off residual organic solvents from the composition, also serves to at least partly cure the capacitor material. Most significantly, heating this size structure as defined has proven to substantially eliminate the possibility of the capacitor material from flaking, the deleterious results of such flaking being cited above.

Once the structure of FIG. 1 has cooled from the above heating, a second conductor member 25 is then applied atop the capacitor material 21. Member 25 is preferably of the same material and thickness as member 23. This layered member 25, also a solid sheet of copper or copper alloy, is preferably bonded to the formed layer of capacitor material 21 using conventional PCB lamination processing. Alternatively, layered member 25 may be formed atop material 21 using conventional sputtering processing. During such sputtering, a thin layer of the copper metal is vacuum deposited onto material 21. Such sputtering may also include depositing a barrier metal layer prior to the copper layer, such a barrier layer typically comprising chrome or titanium with a thickness of 50 Angstroms to approximately 500 Angstroms. The sputtered copper layer may then be used as a seed layer for subsequent electroplating of a copper layer, if desired. Other methods may be used for depositing the copper or copper alloy layer 25. The invention is not limited to those methods described above. The lamination procedure, if used and at a sufficiently high temperature and pressure, will serve to further cure the capacitor material from the partly cured state following the oven heating described above.

Figure 4:
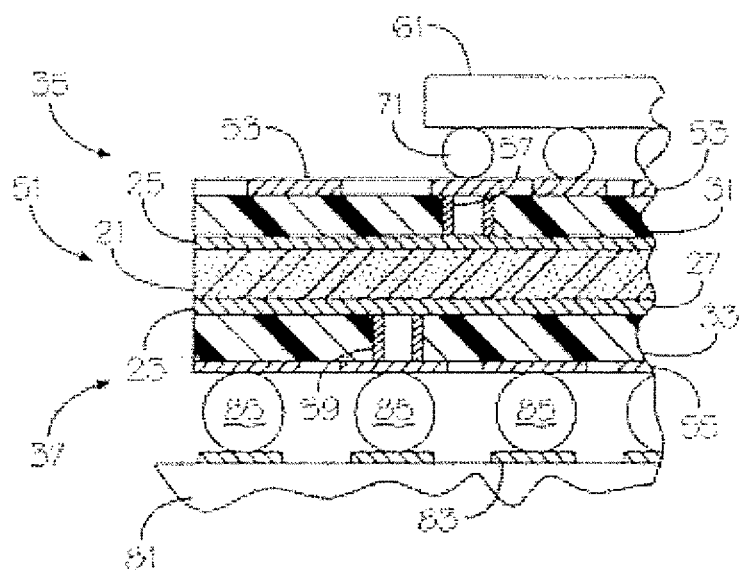
FIG. 4 is a side elevational view, in section and on an enlarged scale, illustrating the capacitive substrate of FIG. 3, after having been subjected to further processing.

The three-layered structure of FIG. 2, in its simplest form as shown, is now capable of serving as a capacitor 27 within a capacitive substrate (below). The invention is not limited to said form, however, as it is often desirable to further process the FIG. 2 structure, including for example to "personalize" each of the conductor layers 23 and 25. Such personalizing is known in the PCB art and typically includes use of photolithographic processing in which a photoresist is applied to the metal conductors, exposed and developed, following which etching of selected, unprotected portions of the conductor layers occurs. The result is a pattern of individual conductors, including possibly lines and/or pads. Selected ones of said lines and/or pads may then serve as the electrodes for the internal capacitor. Thus it is possible for each of the conductor layers 23 and 25 (FIG. 2) to include several individual pads or lines that each serve as a capacitor electrode for a corresponding electrode on the opposite conductor. The conductors shown in FIG. 2 and FIG. 4 are thus shown in singular form for ease of explanation, it being understood that additional combinations are readily possible.

Figure 3:
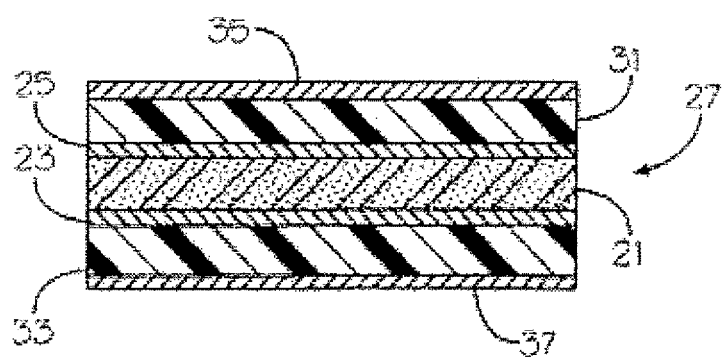
FIG. 3 is a side elevational view, in section and on an enlarged scale, illustrating the initial steps of making a capacitive substrate in accordance with one embodiment of the invention, this substrate utilizing the capacitor of FIG. 2.

FIG. 3 represents some of the initial steps in forming a capacitive substrate according to one embodiment of the invention. In the FIG. 3 structure, layers 31 and 33 of dielectric material are added to opposite sides (top and bottom) of the structure, following which conductor layers 35 and 37 are added. Layers 31 and 33 are preferably applied using conventional PCB lamination processing and equipment. Layers 35 and 37 are preferably also applied using such conventional lamination processing. Further description is not deemed necessary. Unlike the capacitor material 21, the dielectric materials usable for layers 31 and 33 include the aforementioned fiberglass-reinforced epoxy resin, some referred to as "FR-4" dielectric materials in the art, polytetrafluoroethylene (Teflon), polyimide, polyamide, cyanate resin and photo-imageable material.

Other dielectric materials usable for layers 31 and 33 include bismaleimide, benzoxazine and halogen-free resin. Such material may be additionally reinforced with discrete ceramic particles added thereto. The conductor layers 35 and 37 are of similar material as layers 23 and 25, this being copper or copper alloy, and are formed from foil sheets of said material. In one embodiment, each dielectric layer may have a thickness of only approximately two mils, while the corresponding thickness of the outer conductor layer atop same may have a thickness of only approximately one mil. These are only meant as examples, however, and not intended to limit the invention. Significantly, capacitor 27 is now internally located within the multi-layered structure of FIG. 3.

Figure 2:
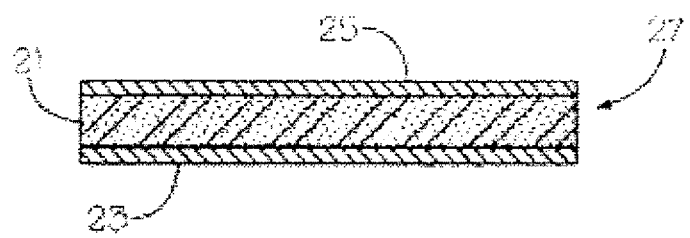

As with the structure of FIG. 2, the seven-layered structure of FIG. 3 may now be subjected to further processing, including the personalizing of each of the outer conductor layers 35 and 37. Such personalizing may be accomplished using the above described photolithographic processing as usable for previous outer conductor layers 23 and 25. Additionally, it may also be desirable to form thru-holes within selected portions of the structure prior to its final assembling to other electrical elements.

The embodiment of FIG. 4 represents but one example of such further processing of the FIG. 3 structure, the result being a capacitive substrate 51 including internal capacitor 27 therein, and the shown additional dielectric and conductor layers. The FIG. 3 structure is capable of more modifications than shown in FIG. 4. Specifically, it may be possible to add even more dielectric and conductor layers onto the formed capacitor member 27.

In FIG. 4, the outer conductor layers 35 and 37 have been personalized to now include a plurality of individual lines/pads 53 and 55, respectively. Additionally, thru-holes 57 and 59 are formed within layers 31 and 33, respectively. Each hole 57 and 59 is preferably formed by drilling, using a conventional mechanical drill or laser and, following such drilling, each is plated initially with a first thin layer of palladium (as a seed), followed by a thin layer of electro-less copper and finally a thicker layer of electrolytic copper.

In one embodiment, the total thickness of both copper layers combined is 0.5 mil. As is understood, other metallurgies and thicknesses are possible. Significantly, thru-hole 57 serves to electrically couple one of the pads 53 on layer 35 to the interim conductor layer 25. This pad and the adjacent thru-hole 57 are thus part of a circuit connected to layer (and now electrode) 25. Similarly, a selected one of the bottom pads 55 of layer 37 is coupled to the opposite layer (electrode 23) of capacitor 27. This pad 55 and the thru-hole are also part of the circuitry including the capacitor.

In the FIG. 4 embodiment, an electrical component 61 such as a semiconductor chip or even a chip carrier, when positioned atop capacitive substrate 51 and coupled thereto as shown, using a plurality of solder balls 71 of conventional material, is capable of being electrically connected to selected signal, power and/or ground layers which may form part of the capacitive substrate. Component 61 may also be coupled to the internal capacitor 27. Likewise, another electrical structure such as a multi-layered PCB 81 may also have substrate 51 positioned thereon and electrically joined thereto. And further likewise, one or more of the PCB's pads/lines 83 (only one shown in FIG. 4) may be connected to the opposite side of capacitor 27, also using solder balls 85 of conventional solder material. A circuit path is thus formed including this one pad/line 83, the attached solder ball 85, the single pad/line 55, thru-hole 59, capacitor 27, thru-hole 57, single pad 53 and attached solder ball 71, such that component 61 is capacitively coupled to underlying circuit structure (PCB) 81.

Figure 5:
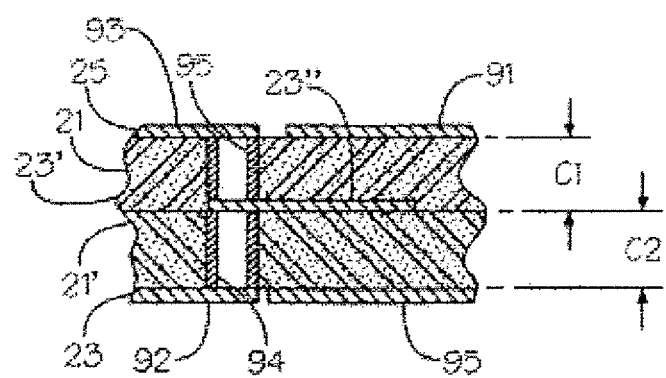
FIG. 5 is a side elevational view, in section and on an enlarged scale over the view of FIG. 3, illustrating an alternative embodiment of a capacitive substrate of the invention.

Although showing only one path including internal capacitor 27, the invention is also capable of having more than one such path by providing conductor member 25 with two isolated pads/lines and a corresponding paid within member 23. In such an example, two of the pads/lines 53 may be coupled to the capacitor 27. Likewise, two of the pads/lines 55 might also be connected to the opposite conductor 23. Two thru-holes would also be used as past of such a dual circuit path. Other combinations are also possible using the teachings herein. The structure of FIG. 5 is adapted for use in many environments, including particularly as part of an information handling system. Such a final system may include more than one such PCB 81, substrates 51 and components 61.

FIG. 5 depicts the formation of at least two capacitors C1 and C2 within a single capacitive substrate structure. The structure in FIG. 5 may be similar to that in the above FIGS. 3 and 4, with the addition of a second layer 21' of capacitor material, and the provision of an interim conductor layer 23' (shown by way of example as a single conductor 23").

Layer 21' may be formed onto layer 23' similar as layer 21 was formed onto layer 23 in FIG. 1. Formation of a single conductor 23" may then be formed by conventional procedures, including the aforementioned photolithographic processing.

These capacitors may have similar or different values, again illustrating the versatility of the invention. In one example, C1 may have a value of 1 nF/inch$^2$, while C2 may possess a larger value of 100 nF/inch$^2$. Capacitor C1 is shown to comprise common electrode 23" and electrode 91. Conductor 23" in turn is part of a circuit including opposing conductors 92 and 93 due to connections via thru-holes 94 and 95, respectively, it being understood that one of said conductors may be eliminated, as may be the associated thru-hole. Capacitor C2 in turn comprises common electrode 23" and electrode 95. Each electrode 91 and 95 may in turn be coupled to external components such as component 61 and PCB 81. Understandably, many different combinations of electrodes may be utilized to form two capacitors and the invention is not limited to the specific example shown. Moreover, the invention is not limited to one or two internal capacitors for a capacitive substrate; it is within the scope of the invention to provide many more, if operational requirements dictate.

As with the substrate of FIG. 4, several additional conductor and dielectric layers may also be added, and preferably are, to the FIG. 5 embodiment.

According to the teachings of the instant invention, it is possible to vary the capacitance values of the capacitors formed by varying the thicknesses of the capacitance dielectric materials and/or the materials themselves. Core materials may consist of laser drillable dielectric materials, polymer nanocomposite based flake-free resin coated copper, and resistor foil or printable capacitors and resistors with variable sheet resistance.

The following Examples represent various combinations of materials and processes used to form a low loss capacitance and low loss insulating dielectric material according to various aspects of the invention. These are understood to be examples only and not limiting of the scope of this invention.

EXAMPLE 1

50 grams (gm) of a polyphenylene ether in toluene solution was mixed together with 50 gm of barium titanate (BaTiO$_3$) powder. The composition was ball milled for one day, after which a thin coating of this well dispersed composition was wire-rod coated on a copper substrate (a copper foil) and dried at about 130 degrees C. for three minutes in a standard convection oven. This heating served to substantially remove all residual organic solvents. Following the solvent removal and cooling to room temperature, the coating exhibited substantially no flaking. The material was laminated. The resulting capacitance loss of the laminated capacitor measured about 0.005-0.007 at 1000 Mega-Hertz (MHz).

EXAMPLE 2

32.5 grams (gm) of a polyphenylene ether solution in toluene as the carrier solvent was mixed together with 52.3 gm of barium titanate ($BaTiO_3$) powder. The composition was ball milled for one day, after which a thin coating of this well dispersed composition was wire-rod coated on a copper substrate (a copper foil) and dried at about 130 degrees C. for three minutes in a standard convection oven. This heating served to substantially remove all residual organic solvents. Following solvent removal and cooling to room temperature, the resulting coating exhibited good and utiform quality and substantially no flaking. The materials were laminated and the resulting capacitance loss of the laminated capacitor measured about 0.006-0.009 at 1000 MHz.

Thus there has been shown and described a low loss capacitive substrate formed by using a capacitor material. Two or more capacitors may be formed as part of the capacitive substrate, as explained and illustrated herein. Importantly, the substrate may be formed using many conventional PCB processes to thereby reduce costs associated with production thereof. This capacitive substrate may also be incorporated into a larger, multi-layered structure if desired, including one with more capacitive substrates as part thereof. Such incorporation is possible also using conventional PCB processing, in this case simple lamination at established pressures and temperatures.

The invention as defined herein, if desired, is capable of transmitting both regular and high speed signals, the latter at a rate of from approximately one Gigabit/sec to approximately ten Gigabits/second and even higher, while substantially preventing impedance disruption. Of further significance, the invention is able to utilize thru-holes of very fine definition and is able to assure highly dense circuit patterns, all of which are deemed extremely important to many of today's products using such substrates.

The invention contemplates the multi-layer embedded capacitance and resistance layers having the same copper layer used as an electrode of one of the individual capacitors. In some cases the resistor and capacitor electrode can be shared. It is possible to make two more resistance layers than capacitance layers. In one embodiment, for example, four resistance layers and two capacitance layers are constructed. Layers can be parallel or series connected to achieve variable capacitance and resistance. Additional capacitance layers can be added to achieve the desired level of capacitance. The structure can also remove metal layers from dielectrics as needed to adjust dielectric thickness between signal layers for impedance matching in the signal carrying area of the substrate or printed wiring board.

Figure 6A:
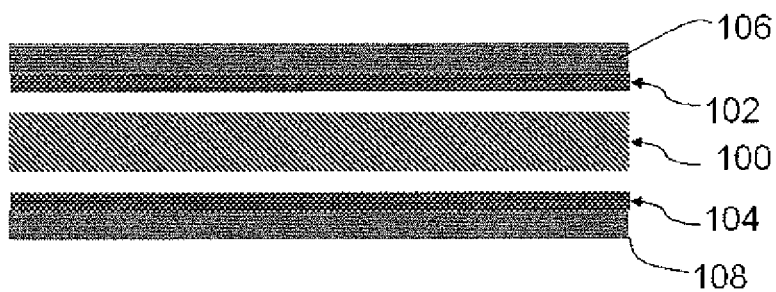
FIGS. 6a through 9e are schematic representations of the process steps in accordance with the present invention.
Figure 6B:
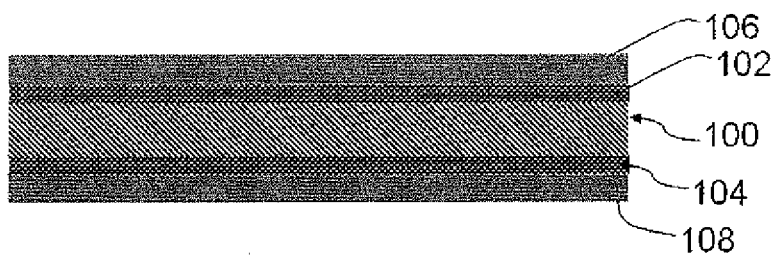
Figure 6C:
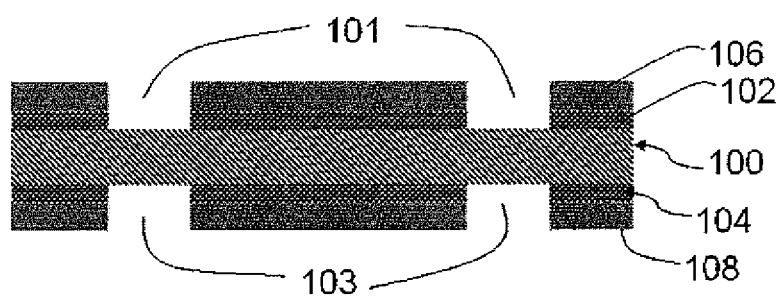
Figure 6D:
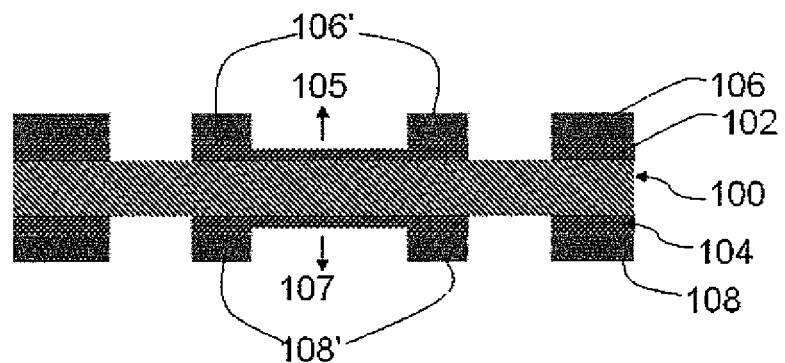

Referring now to FIGS. 6a through 9e, there are shown process steps in producing the multi-layer embedded capacitance and resistance substrate core in accordance with the present invention. A laser drillable dielectric 100 is first provided (FIG. 6a). Resistance layers 102, 104 are deposited on either side (upper or lower) of dielectric 100. Copper foil 106, 108 is applied to resistance layers 102, 104, respectively. The aforementioned layers 102, 104, 106, 108 are then laminated to dielectric 100, resulting in the structure shown in FIG. 6b. In these embodiments, layers 102, 104 may possess a thickness of from few Angstrom (Å) to approximately 4 mils while conductor 106, 108 may include a thickness of from approximately 0.2 mil to approximately 2.5 mils. Conductors 106, 108 form part of a circuit for the invention.

Resist is applied to the structure and developed, as is well known in the art of printed circuit board manufacturing. Copper layers 106, 108 and resistance layers 102, 104 are etched with a cupric etchant to generate openings 101 and 103. The resist is then stripped, resulting in the structure shown in FIG. 6c.

The resist is again applied and developed and copper is selectively etched with ammoniacal etchant. The resist is stripped, resulting in the structure shown in FIG. 6d. Selective copper etching exposes resistance materials and generates openings 105 and 107. Etched copper 106' with opening 105 on resistance material will act as an individual resistor where etched copper pair 106' acts as an electrode for individual resistors.

Figure 7A:
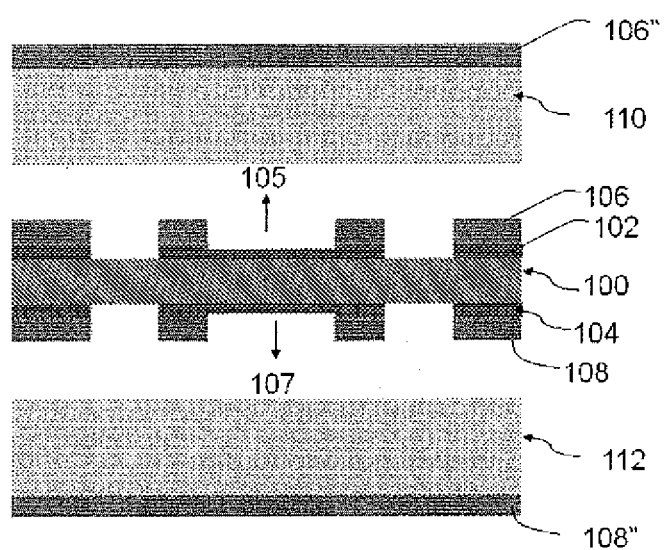
Figure 7B:
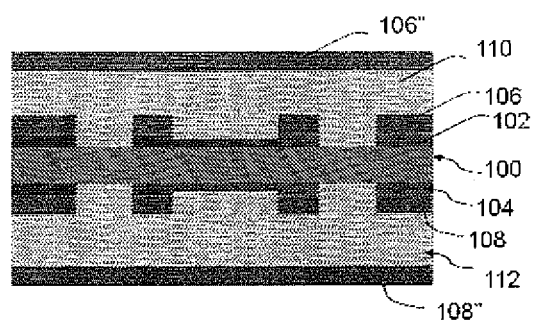
Figure 8A:
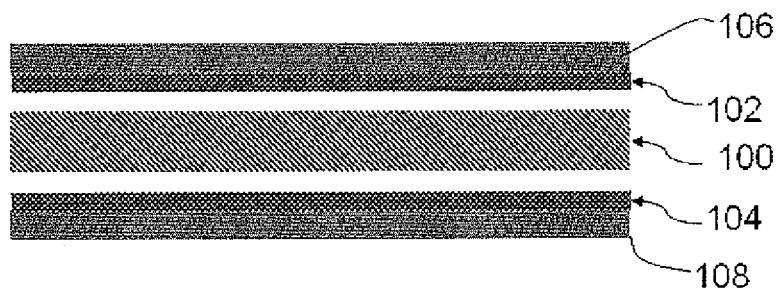
Figure 8B:
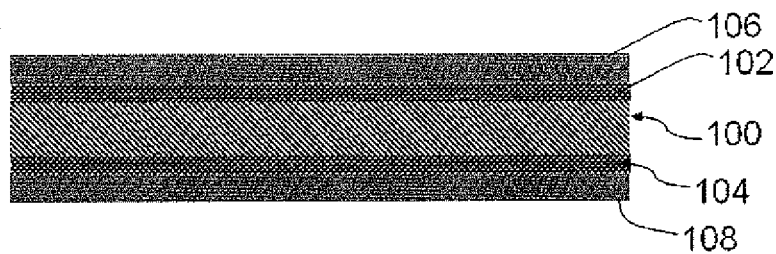
Figure 8C:
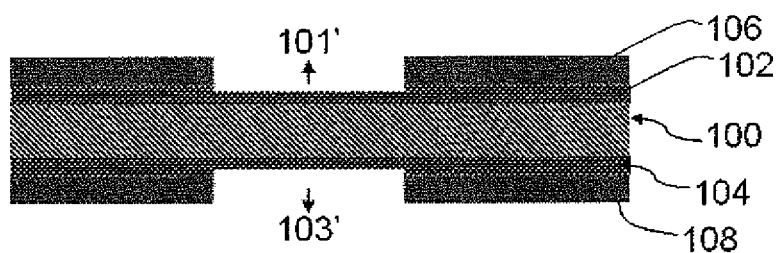

Copper coated capacitance layers 110, 112 are then positioned above and below the structure, respectively, as shown in FIG. 7a. The new structure is then laminated and the empty copper spaces 101, 103, 105, 107 are filled with capacitance materials, as shown in FIG. 7b. The layer of capacitance material 110, 112 is bonded with external Cu 106" and 108". A further significant aspect of the invention is that the formed capacitance layer may be screen printed directly (FIG. 9.) A layer of capacitance material can be screened through a mesh screen onto the surface of a core (FIG. 9). This capacitance layer can be cured at approximately 1500° C. for approximately two hours, followed by an additional cure at approximately 1900° C. for approximately one hour. The second electrical conductor may be formed using a sputtering operation followed by a copper electroplating process and a photolithographic etch step. Furthermore, screen printing provides multiple capacitance density material deposition in the same layer resulting in a variable capacitance density layer.

Resist is again applied and developed, and then etched and stripped. Micro-via 114, 116 and thru-via 118 connections are then created, as shown in FIG. 7c. Note that the resistance and capacitance layers include the same copper layer, which is used as one of the individual capacitor and resistor electrodes. It is also possible to create two more resistance layers than the number of capacitance layers, as shown with respect to FIGS. 8a-9e. As aforementioned, once laser drillable dielectric is provided and respective resistance layers and copper foil layers are disposed on both sides thereof, the structure is laminated, resulting in the FIG. 8b schematic. The resist is applied and developed and selective copper etching is performed with ammoniacal etchant. The resist is then stripped, forming the structure shown in FIG. 8c. Again, selective copper etching exposes resistor materials and generates openings 101' and 103'.

Figure 9A:
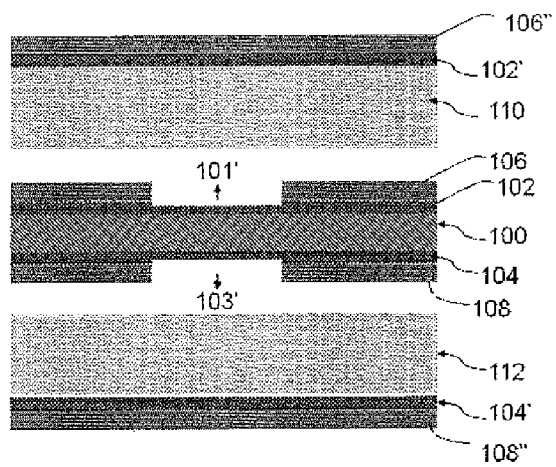
Figure 9B:
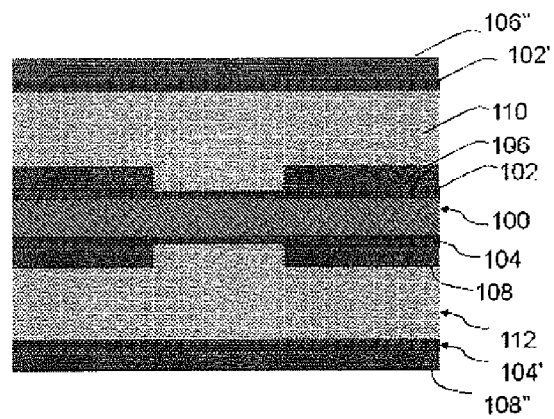
Figure 9C:
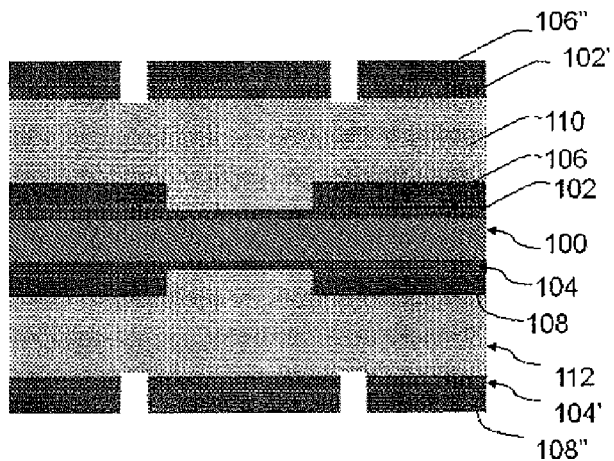

Copper 106", 108" and resistance material 102', 104' and coated capacitance layers 110, 112 are provided (FIG. 9a), followed by lamination as shown in FIG. 9b, wherein empty copper spaces 101', 103' are filled by capacitance materials. Once again, resist is applied and developed and copper etching is selectively performed with ammoniacal etchant. The resist is then stripped, resulting in the structure shown in FIG. 9d. In these embodiments, layers 102', 104' may possess a thickness of from a few Angstroms to approximately a few microns while conductor 106", 108" may include a thickness of from approximately 0.2 mil to approximately 2.5 mils. Conductors 106", 108" form part of a circuit for the invention.

Figure 9D:
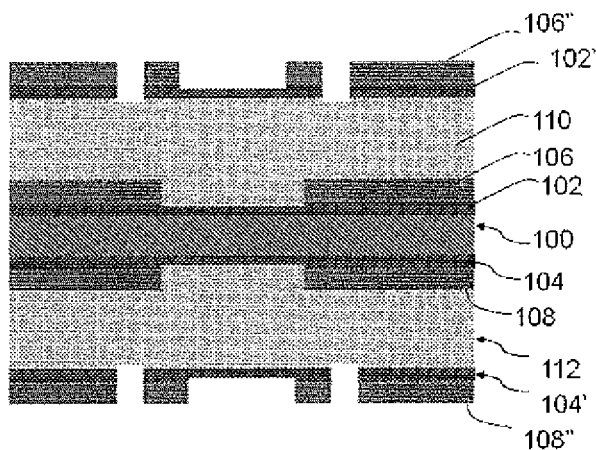
Figure 9E:
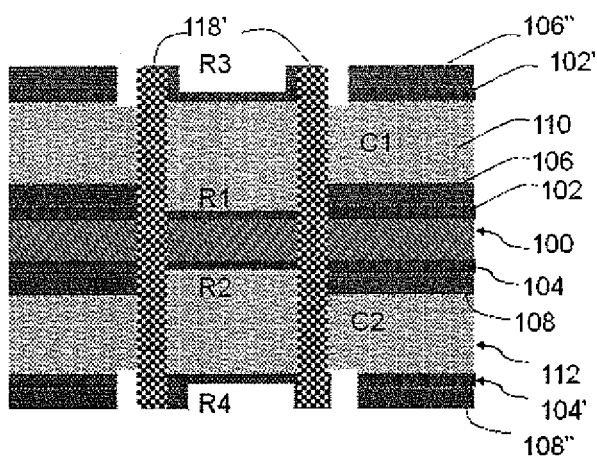

FIG. 9e shows a typical substrate structure with embedded resistors and capacitors. It can be seen that additional capacitance and resistance layers can be embedded in a substrate to achieve a desired level of capacitance and resistance. The built up dielectric layers are added to the upper and lower portions of the substrate, as needed to complete the substrate. The left portion of FIG. 9e depicts a schematic view of a typical set of via structures of the substrate. FIG. 9d shows four layers of resistance materials and two layers of capacitance materials. The four layers of resistance material can produce many individual resistors. In FIG. 9e, at least four individual resistors R1, R2, R3 and R4 are generated from four different resistance layers.

Similarly two capacitance layers can produce many individual capacitors. In FIG. 9e, at least two capacitors C1, C2 are generated from two capacitance layers. Thru via 118' has a parallel connection among the four resistor electrodes and thru-via 118' has a parallel connection for capacitor electrodes 106,108 to double the overall capacitance (C1+C2).

Referring now to FIGS. 10a-17b, there are shown embodiments of the multi-layer embedded capacitance and resistance substrate core in accordance with the present invention. The descriptions utilized hereinbelow describe the structure of the embodiment shown and further description of processing in the PCB art is not deemed necessary.

Figure 10A:
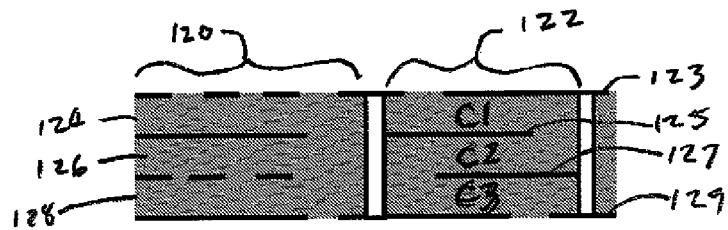
FIGS. 10a through 15b are schematic representations of different embodiments in accordance with the present invention.

FIGS. 10a through 10e depict low loss capacitive materials simultaneously acting as a capacitor 122 as well as dielectric for signal layers 120. Capacitive layers 124, 126, and 128 are segregated with metal coatings 123, 125, 127, and 129. The total capacitance of capacitor 122 in FIG. 10a is C1+C2+C3. It is also possible that signal layer 120 is completely removed to produce large clearance in the capacitance layer for RF (radio frequency) applications.

Figure 10B:
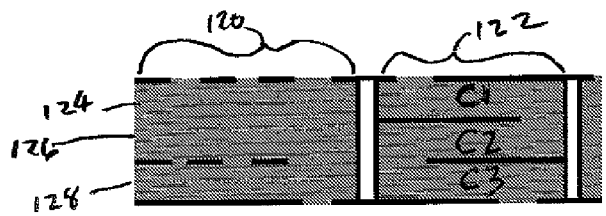

FIG. 10b differs from FIG. 10a in that metal layer 125 is removed from signal area 120 to adjust dielectric thickness between signal layers for impedance matching, and total capacitance of capacitor 122 in FIG. 10b is still C1+C2+C3.

Figure 10C:
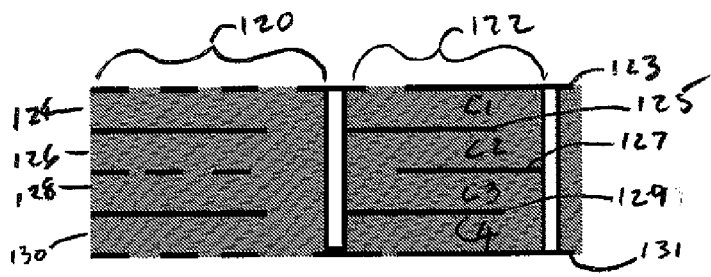

FIG. 10c differs from FIG. 10a and FIG. 10b in that metal layer 131 is added to the bottom of new capacitive layer 130. Total capacitance of capacitor 122 in FIG. 10c increases to C1+C2+C3+C4.

Figure 10D:
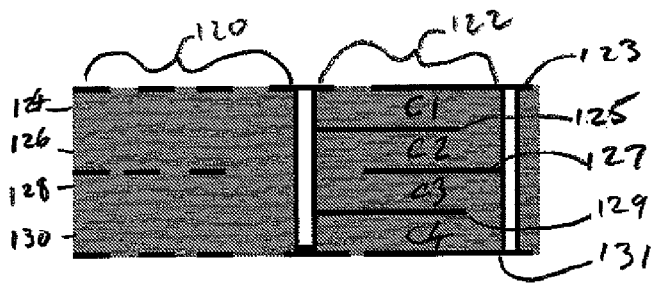

FIG. 10d differs from FIG. 10c in that metal layers 125 and 129 are removed from signal area 120 to adjust dielectric thickness between signal layers for impedance matching, and total capacitance of capacitor 122 in FIG. 10d remains C1+C2+C3+C4.

Figure 10E:
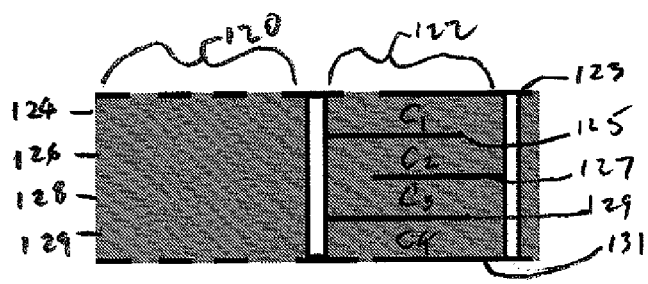

FIG. 10e differs from FIG. 10d in that metal layer 127 is removed from signal area 120 to adjust dielectric thickness between signal layers for impedance matching, and total capacitance of capacitor 122 in FIG. 10e remains C1+C2+C+C4.

Figure 11A:
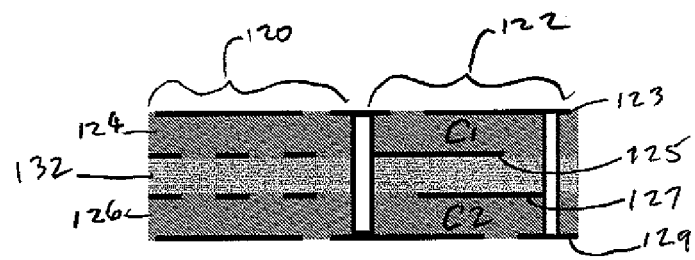
Figure 11B:
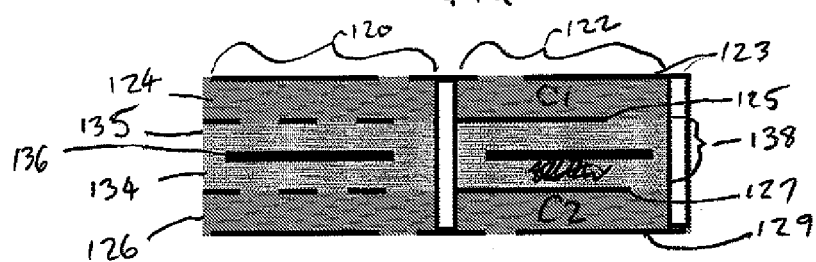

FIG. 11a and FIG. 11b depict low loss capacitive materials having similar dielectric loss as core materials. As in FIGS. 10a through 10e, capacitor 122 and signal layers 120 are represented.

FIG. 11a shows capacitive layers 124 and 126 laminated on core 132 segregated with metal coatings 123, 125, 127, and 129. Again, but not shown, metal layer 127 can be removed from signal area 120 to adjust dielectric thickness between signal layers for impedance matching The total capacitance of capacitor 122 in FIG. 11a is C1+C2.

FIG. 11b shows capacitive layers 124 and 126 laminated to a build up core 138 containing a CIC layer 136 and two surrounding layers, 134 and 135 of, for example, Rogers 2800 dielectric segregated with metal coatings 123, 125, 127, and 129. Again, but not shown, metal layer 127 can be removed from signal area 120 to adjust dielectric thickness between signal layers for impedance matching The total capacitance of capacitor 122 in FIG. 11b is C1+C2.

FIGS. 12a through 12e show a sequential build up process to create a joining core 160 (FIG. 12d) and a subcomposite layer 162 (FIG. 12e) that combine to produce the structures of FIGS. 13 through 15. Again, the descriptions utilized hereinbelow describe the structure of the embodiment shown and further description of processing in the PCB art is not deemed necessary.

Figure 12A:
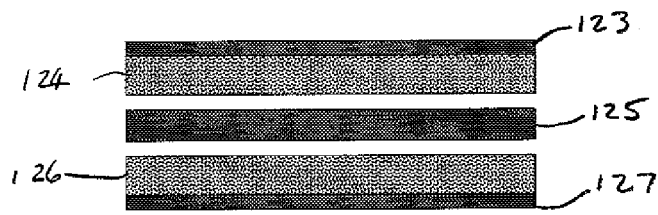
Figure 12B:
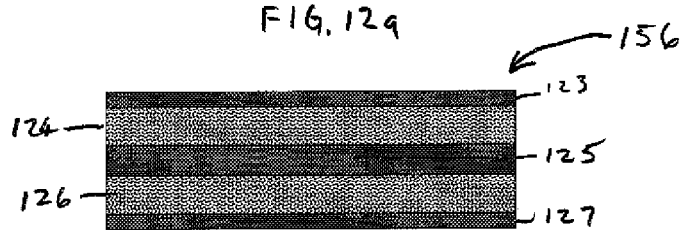

FIG. 12a shows capacitive layer 124 having metal layer 123 and a second capacitive layer 126 with metal layer 127 positioned on either side of central metal layer 125, and subsequently B-staged laminated together to create a laminated assembly 156, as shown in FIG. 12b. Partially cured capacitive layer is further bondable with other circuitized substrate using a lamination process. This is a three stage curing. First capacitive layer 124, 126 is heat-treated at 120-140 C to remove residual solvents and B-staged laminated to bond with metal layer 125, but capacitive layers 124, 12b is not completely cured after B-stage lamination; it is still a bondable dielectric. Capacitive dielectric 124, 126 in FIG. 12d (160) is bonded with subcomposite 162 (FIG. 13) during composite lamination. This composite lamination provides a fully cured capacitive layer/dielectric.

Figure 12C:
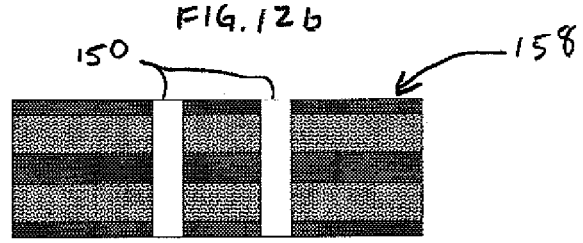

Laminated assembly 156 is further modified in FIG. 12c by adding laser-drilled thru-holes 150 to create a drilled assembly 158. Drilled assembly 158 is the basis for joining core 160 (FIG. 12d) and a subcomposite layer 162 (FIG. 12e).

Figure 12D:
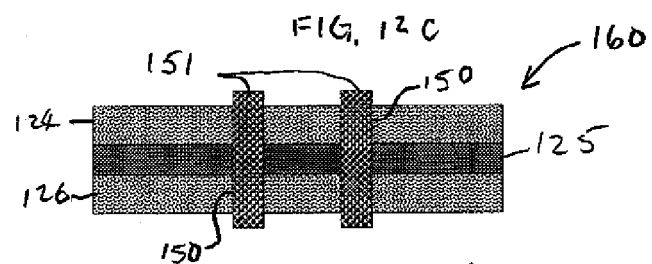

FIG. 12d shows a joining core 160 having conducting paste 151 placed within thru-holes 150 and metal layers 123 and 127 removed by means of an etching process.

Figure 12E:
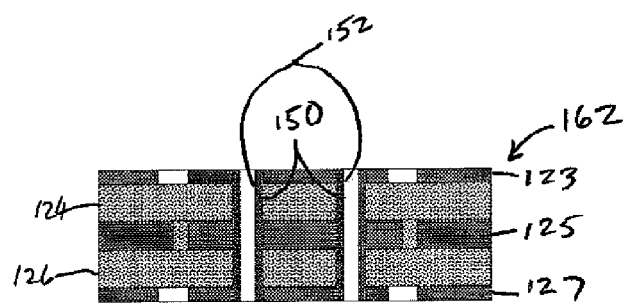

FIG. 12e shows subcomposite layer 162 having plating placed within thru-holes 150 to create PTHs 152 to connect, if needed, metal layers 123, 125, and 127 to each other to create a 2s1p sub-composite with two possible capacitance layers, 124 and 126. Here, capacitive layer 124 and 126 is completely or partially cured. But capacitance layer 124 and 126 is able to fill the clearances of 125 during lamination.

Figure 13A:
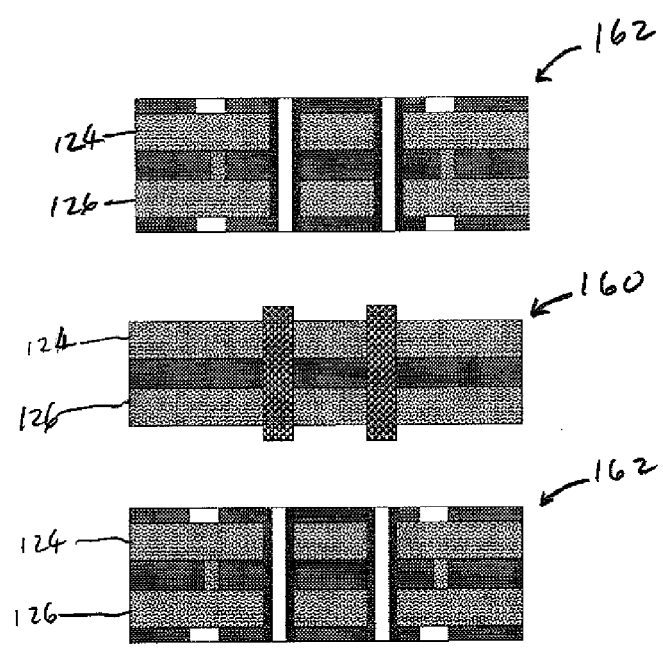
Figure 13B:
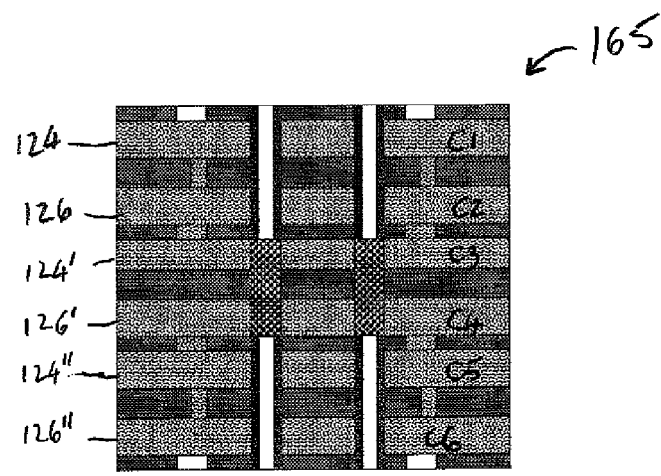

FIG. 13a shows a joining core 160 aligned with two subcomposite layers 162 prior to lamination, and after lamination, creating the composite structure 165 of FIG. 13b containing all capacitance materials in dielectric layers 124, 126, 124', 126', 124", and 126", allowing up to six individual capacitors in the shown and described embodiment. An alternate embodiment would create a composite structure (not shown), similar to FIG. 13b, where only the joining core 160 would contain capacitive materials within the individual build-up layers 124' and 126', respectively, and the two subcomposite layers (not shown) would contain non-capacitive dielectric material creating a composite structure with a capacitance joining layer. It is also shown that capacitive materials in the joining core can flow within the circuitry 162 and 165 to fill the gap during composite lamination. FIG. 13b is a schematic, not a true representative of parallel capacitors. For true parallel capacitor, layer 1,3,5,7 is connected with one PTH and layer 2,4,6 is connected with another PTH to make the parallel capacitor operational.

Figure 14A:
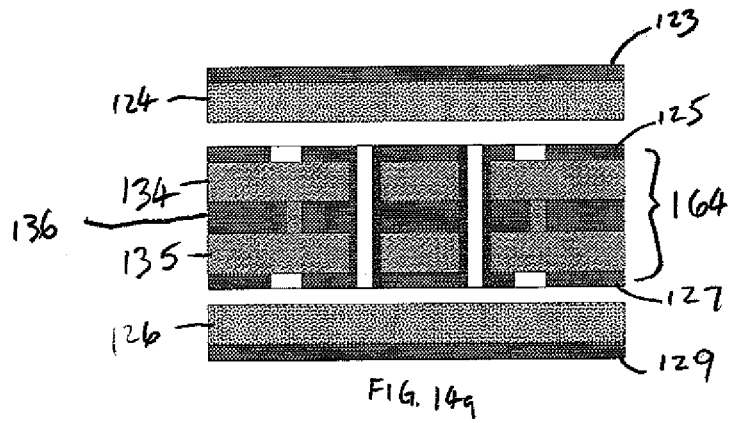
Figure 14B:
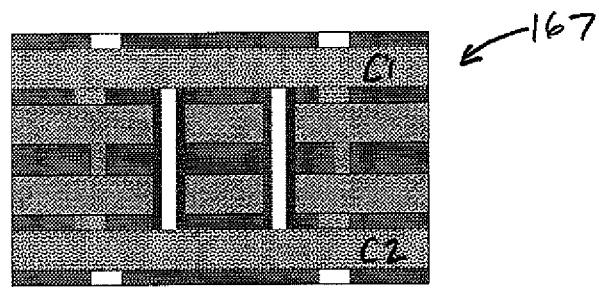

FIG. 14a shows capacitive layer 124 having metal layer 123 and a second capacitive layer 126 with metal layer 129 positioned on either side of build up core 164 containing a CIC layer 136 and two surrounding layers, 134 and 135 of, for example, Rogers 2800 dielectric segregated with metal coatings 125 and 127 creating a composite structure with capacitors C1 and C2 encompassing subcomposite layer 164, and subsequently laminated together to create a laminated assembly 167, as shown in FIG. 14b that can be used for HyperBGA applications. Again, capacitive layer flows and fills the gap during composite lamination.

Figure 15A:
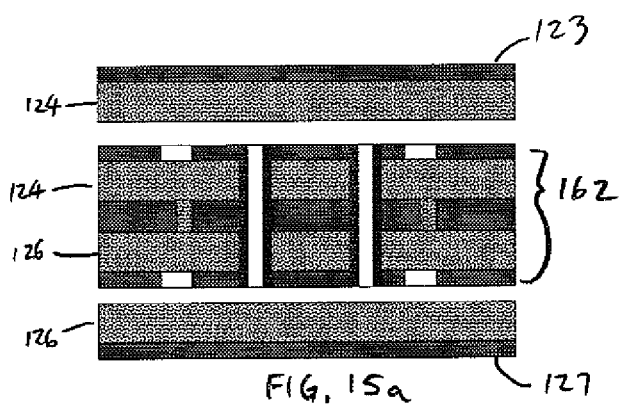
Figure 15B:
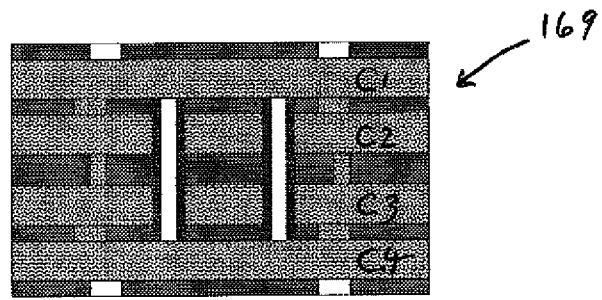

FIG. 15a shows capacitive layer 124 having metal layer 123 and a second capacitive layer 126 with metal layer 127 positioned on either side of central subcomposite layer 162 containing capacitive material 124 and 126 creating a composite structure with capacitors C1, C2, C3, and C4, if needed, encompassing subcomposite layer 162 and subsequently laminated together to create a laminated assembly 169, as shown in FIG. 15b. Again, FIG. 15b is a schematic, not a true representative of parallel capacitors. For true parallel capacitor, layer 1,3,5 is connected with one PTH and layer 2,4,6 is connected with another PTH to make the parallel capacitor operational.

Since other modifications and changes varied to fit particular operating requirements and environments will be apparent to those skilled in the art, the invention is not considered limited to the examples chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A temperature stable, frequency stable low loss capacitance and temperature stable, frequency stable low loss insulating dielectric material having non-flaking characteristics for use with electronic circuit boards, comprising:
   a) thermosetting resin;
   b) thermoplastic resin;
   c) cross-linker;
   d) ferroelectric ceramic particles comprising barium titanate; and
   e) means for modifying the effective dielectric material thickness to provide impedance matching within a layer of substrate.

2. The material in accordance with claim 1, wherein said thermosetting resin is selected from a group consisting of: modified poly(phenylene) ether (MPPE), epoxy resin, high temperature diglycidyl ether, polyimide, cyanate ester (triazines) and bismaleimide blends, triazine-bismaleimide and epoxy modified blend, benzoxazine, epoxy modified benzoxazine, halogen free benzoxazine, fluoropolymer, benzocyclobutene, perfluorobutane, polyphenylenesulfide, polysulfone, polyetherimide, polyetherketone, polyphenylquinoxaline, polybenzoxazole, polyphenyl benzobisthiazole and combinations thereof.

3. The material in accordance with claim 2, wherein said thermosetting resin comprises an amount of approximately 5% to approximately 90% by weight of said material.

4. The material in accordance with claim 1, wherein said thermoplastic resin is selected from a group consisting of: polyolefins such as polypropylene, polysulfones, polycarbonates, nitrile rubbers, polymers based on second generation styrenic block copolymers with a hydrogenated midblock of styrene-ethylene/butylene-styrene (SEBS) or styrene-ethylene/propylene-styrene (SEPS), ABS polymers, and fluorocarbon polymers such as polytetrafluoroethylene, polymers of chlorotrifluoroethylene, fluorinated ethylenepropylene polymers, polyvinylidene fluoride and polyhexafluoropropylene and combinations thereof.

5. The material in accordance with claim 4, wherein said thermoplastic resin comprises an amount of approximately 5% to approximately 50% by weight of said material.

6. The material in accordance with claim 1, wherein said cross linker is selected from a group consisting of: at least one cyanurate selected from the group consisting of triallyl isocyanurate and triallyl cyanurate and combinations thereof.

7. The material in accordance with claim 6, wherein said cross linker comprises an amount of approximately 2% to approximately 65% by weight of said material.

8. The material in accordance with claim 1, wherein said ferroelectric ceramic is selected from a group consisting of: barium titanate, substituted barium titanate, strontium titanate, lead titanate, lead zirconate titanate, substituted lead zirconate titanate, solid solutions of lead magnesium niobate and lead titanate, solid solutions of lead zinc niobate and lead titanate, lead iron tantalite, other ferroelectric tantalates, and combinations or mixtures thereof.

9. The material in accordance with claim 8, wherein said ferroelectric ceramic comprises an amount of approximately 40% to approximately 75% by weight of said material.

10. The material in accordance with claim 8, wherein said ferroelectric ceramic particles comprises nanoparticles.

11. The temperature stable, frequency stable low loss capacitance and temperature stable, frequency stable low loss insulating dielectric material having non-flaking characteristics for use with electronic circuit boards in accordance with claim 1, wherein said means modifying the effective dielectric material thickness to provide impedance matching within a layer of substrate comprises at least one internal capacitor formed in said layer.

* * * * *